United States Patent
Kim

(10) Patent No.: US 11,435,846 B2
(45) Date of Patent: Sep. 6, 2022

(54) TOUCH DISPLAY DEVICE, DRIVER CIRCUIT, AND DRIVING METHOD

(71) Applicant: LG DISPLAY CO., LTD., Seoul (KR)

(72) Inventor: HyongHwan Kim, Cheongju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/119,025

(22) Filed: Dec. 11, 2020

(65) Prior Publication Data
US 2021/0191561 A1    Jun. 24, 2021

(30) Foreign Application Priority Data
Dec. 23, 2019 (KR) .......................... 10-2019-0173319

(51) Int. Cl.
*G06F 3/041* (2006.01)
*G06F 3/044* (2006.01)

(52) U.S. Cl.
CPC .......... *G06F 3/0416* (2013.01); *G06F 3/0441* (2019.05); *G06F 2203/04114* (2019.05)

(58) Field of Classification Search
CPC ................. G06F 3/0416; G06F 3/0441; G06F 2203/04114; G06F 3/0412; G06F 3/04166; G06F 3/04186; G06F 3/0443; G06F 3/0446; G06F 3/04164; G06F 3/04162; G06F 3/044; H01L 27/323; G09G 2354/00

See application file for complete search history.

(56) References Cited

U.S. PATENT DOCUMENTS

| | | | |
|---|---|---|---|
| 2015/0177881 A1* | 6/2015 | Chen | ..................... G06F 3/0445 345/174 |
| 2016/0019827 A1* | 1/2016 | Lee | ........................ G06F 3/0412 345/204 |
| 2017/0068384 A1* | 3/2017 | Kim | .................... G06F 3/04166 |
| 2017/0108993 A1* | 4/2017 | Lee | ..................... G06F 3/04166 |

* cited by examiner

*Primary Examiner* — Amit Chatly
(74) *Attorney, Agent, or Firm* — Birch, Stewart, Kolasch & Birch, LLP

(57) ABSTRACT

Provided are a touch display device, a driver circuit, and a driving method. Combined integrated circuits generate a load-free common voltage supplied to touch electrodes during a touch sensing period, thereby preventing signal distortion and improving the performance of touch sensing. Gate driving integrated circuits generate a load-free gate low voltage supplied to gate lines during the touch sensing period, thereby preventing signal distortion and improving the performance of touch sensing.

20 Claims, 15 Drawing Sheets

TOUCH DISPLAY DEVICE, DRIVER CIRCUIT, AND DRIVING METHOD

CROSS REFERENCE TO RELATED APPLICATION

This application claims priority to the Korean Patent Application No. 10-2019-0173319, filed in the Republic of Korea on Dec. 23, 2019, the entire contents of which are hereby expressly incorporated by reference for all purposes as if fully set forth herein into the present application.

BACKGROUND

Field

Embodiments of the present disclosure relate to a touch display device, a driver circuit, and a driving method.

Description of Related Art

Along with the development of multimedia, the importance of flat screen display devices is increasing. In this regard, various flat screen display devices, such as liquid crystal displays (LCD), plasma display panels (PDP), and organic light-emitting displays, have been made commercially available.

Among such flat screen display devices, a liquid crystal display has come into widespread use as mobile flat screen display devices, due to merits thereof, such as high image quality, lightness weight, a thin profile, and low power consumption. In particular, the liquid crystal display has been used in a variety of forms in notebook computers, computer monitors, TVs, and the like.

Touch display devices respectively provided by stacking touchscreen panels on such as a liquid crystal display are widely used. When a point on the touchscreen panel is touched by a finger, a stylus pen, or the like, touch display devices can detect the touch point on the basis of a change in electric characteristics, such as resistance or capacitance, of the touch point, thereby outputting information corresponding to the touch point or performing a calculation corresponding to the touch point. Such touch display devices are one type of user interface, and applications thereof are increasingly being applied to small portable terminals, office devices, mobile devices, and the like.

However, such touch display devices, fabricated by stacking a separate touchscreen panel on a display panel, can be problematic in that the thickness of the touch display device can be increased, thereby making it difficult to fabricate a touch display device having a thinner profile. Furthermore, the transmission efficiency of light can be reduced during passage of light through the stacked touchscreen panel, and fabrication costs can be increased. To overcome such problems, advanced incell touch (AIT) display devices respectively including touch electrodes embedded in pixel areas thereof have recently been proposed.

The driver circuit of such a touch display device includes a plurality of combined integrated circuits (also referred to as source-readout integrated circuits (SRICs)) connected to the display panel, and performs touch sensing by applying a touch driving signal to touch electrodes, the touch driving signal being supplied from a touch power integrated circuit disposed externally.

In a case in which the driver circuit determines a touch event (i.e., determines whether or not the touchscreen panel has been touched) using a touch sensing control signal supplied from an external micro control unit as described above, even when the touch display device is operating in low power mode, the micro control unit must supply the touch sensing control signal to the combined integrated circuits in order to determine the touch event, thereby increasing power consumption in the low power mode.

In addition, load-free driving for reducing the effect of parasitic capacitance of the touch electrodes on the result of the touch sensing can be performed by supplying an alternating current (AC) signal, the phase and amplitude of which are the same as those of the touch driving signal, to the data lines and the gate lines of the display panel during touch sensing period.

However, in the case of load-free driving, a load-free common voltage applied to the touch electrodes as the touch driving signal, in the form of an alternating current signal in which high-level fractions and low-level fractions repeatedly alternate. Resistance and capacitance components (RC components) or noise present between the touch power integrated circuit generating the load-free common voltage and the combined integrated circuits can lower the signal-to-noise ratio (SNR) of a touch sensing signal, which can be problematic.

In particular, such an effect can be more significant in a large touch display device in which the display panel has an increased size.

BRIEF SUMMARY OF THE INVENTION

Various aspects can provide a touch display device, a driver circuit, and a driving method able to sense a load-free common voltage supplied to touch electrodes during a touch sensing period, thereby preventing signal distortion and improving the performance of touch sensing.

Also provided are a touch display device, a driver circuit, and a driving method able to generate the load-free common voltage by a combined integrated circuit, thereby preventing a recognition error due to a signal modification during a process of transmitting a signal to a stylus, such as an active pen.

Also provided are a touch display device, a driver circuit, and a driving method able to generate the load-free common voltage by the combined integrated circuit so that a single touch power integrated circuit can be used in common regardless of the difference in the model of a touch display device, thereby reducing costs related to new design or development.

Also provided are a touch display device, a driver circuit, and a driving method allowing a touch sensing circuit to serve as a buffer in periods in which the load-free common voltage is applied to the touch electrodes, thereby reducing the number of multiplexers by which the load-free common voltage is supplied and reducing the size of a touch driving circuit.

Also provided are a touch display device, a driver circuit, and a driving method able to generate a load-free gate low voltage by a gate driving integrated circuit, the load-free gate low voltage being supplied to gate lines during the touch sensing period, thereby preventing signal distortion and improving the performance of the touch sensing.

According to an aspect, a touch display device can include: a display panel including a plurality of touch electrodes; a gate driving circuit supplying a gate signal to a plurality of gate lines; a data driving circuit supplying a data voltage to a plurality of data lines; and a touch driving circuit generating an AC touch driving signal using a DC common voltage, transferring the AC touch driving signal to the plurality of touch electrodes during a touch sensing period, and generating a touch sensing output voltage according to a change in capacitance of the touch electrodes.

The data driving circuit and the touch driving circuit can be combined to form a single combined integrated circuit.

The touch driving signal can be a load-free common voltage having a predetermined amplitude and phase.

The touch driving circuit can include: a load-free common voltage generating circuit generating a load-free common voltage using the DC common voltage; and a touch sensing circuit generating a touch sensing output voltage using the load-free common voltage and the touch sensing signal.

The load-free common voltage generating circuit can include: a first buffer circuit receiving a high-level DC common voltage; and a second buffer circuit receiving a low-level DC common voltage. The first buffer and the second buffer can generate output signals under control of a high-level switch and a low-level switch connected to output terminals, respectively.

The first buffer circuit can include an operation amplifier receiving the high-level DC common voltage through a non-inverting input terminal thereof, with an output terminal thereof being connected to an inverting input terminal thereof. The buffer circuit can include an operation amplifier receiving the low-level DC common voltage through a non-inverting input terminal thereof, with an output terminal thereof being connected to an inverting input terminal thereof.

The touch sensing circuit can include: an operation amplifier receiving the load-free common voltage through a non-inverting input terminal thereof; and a feedback capacitor and a feedback switch connected in parallel between an inverting input terminal and an output terminal of the operation amplifier.

The touch sensing circuit can further include: an integrating circuit accumulating an output signal of the operation amplifier by predetermined times; and a sampling circuit selectively transferring an output signal of the integrating circuit.

The touch sensing circuit can further include: an input switch located between the display panel and the touch sensing circuit; and an output switch connected to the output terminal of the operation amplifier.

When the touch sensing circuit serves to amplify the touch sensing signal, the input switch and the output switch can be turned on, and the feedback switch is turned off. When the touch sensing circuit supplies the load-free common voltage to the touch electrodes, the input switch and the feedback switch can be turned on, and the output switch is turned off.

The touch display device can further include a level shifter adjusting a level of the load-free common voltage. The level shifter can supply a load-free gate low voltage to the gate driving circuit.

The gate driving circuit can include a load-free gate low voltage generating circuit generating a load-free gate low voltage using a DC gate low voltage.

The load-free gate low voltage generating circuit can include: a first buffer circuit receiving a high-level DC gate low voltage; and a second buffer circuit receiving a low-level DC gate low voltage. The first buffer circuit and the second buffer circuit can generate output signals by controlling a high-level switch and a low-level switch connected to output terminals, respectively.

The first buffer circuit can include an operation amplifier receiving the high-level DC gate low voltage through a non-inverting input terminal thereof, with an output terminal thereof being connected to an inverting input terminal thereof. The buffer circuit can include an operation amplifier receiving the low-level DC gate low voltage through a non-inverting input terminal thereof, with an output terminal thereof being connected to an inverting input terminal thereof.

According to another aspect, a driver circuit of a touch display device can include a data driving circuit supplying a data voltage to a display panel including a plurality of touch electrodes, the driver circuit including: a load-free common voltage generating circuit generating a load-free common voltage using a DC common voltage; and a touch sensing circuit generating a touch sensing output voltage according to a change in capacitance of the touch electrodes, using the load-free common voltage and a touch sensing signal transferred from the display panel.

According to another aspect, provided is a method of driving a touch display device including a gate driving circuit supplying a gate signal to a display panel including a plurality of touch electrodes, a data driving circuit supplying a data voltage to the display panel, and a touch driving circuit supplying a touch driving signal to the display panel and performing touch sensing in accordance with a touch sensing signal received in response to the touch driving signal. The method can include: generating, by the touch driving circuit, an AC touch driving signal using a DC common voltage; transferring the touch driving signal to the plurality of touch electrodes during a touch sensing period; receiving a touch sensing signal according to a change in capacitance of the touch electrodes; and generating a touch sensing output voltage by amplifying the touch sensing signal.

According to embodiments of the present disclosure, the touch display device, the driver circuit, and the driving method can sense a load-free common voltage supplied to touch electrodes during a touch sensing period, thereby preventing signal distortion and improving the performance of touch sensing.

The touch display device, the driver circuit, and the driving method can generate the load-free common voltage by a combined integrated circuit, thereby preventing a recognition error due to a signal modification during a process of transmitting a signal to a stylus, such as an active pen.

The touch display device, the driver circuit, and the driving method can generate the load-free common voltage by the combined integrated circuit so that a single touch power integrated circuit can be used in common regardless of the difference in the model of a touch display device, thereby reducing costs related to new design or development.

The touch display device, the driver circuit, and the driving method can allow a touch sensing circuit to serve as a buffer in periods in which the load-free common voltage is applied to the touch electrodes, thereby reducing the number of multiplexers by which the load-free common voltage is supplied and reducing the size of a touch driving circuit.

In addition, the touch display device, the driver circuit, and the driving method can generate a load-free gate low voltage by a gate driving integrated circuit, the load-free gate low voltage being supplied to gate lines during the touch sensing period, thereby preventing signal distortion and improving the performance of the touch sensing.

BRIEF DESCRIPTION OF THE DRAWINGS

The above and other objects, features, and advantages of the present disclosure will be more clearly understood from the following detailed description, taken in conjunction with the accompanying drawings, in which.

DETAILED DESCRIPTION OF THE EMBODIMENTS

Figure 1:
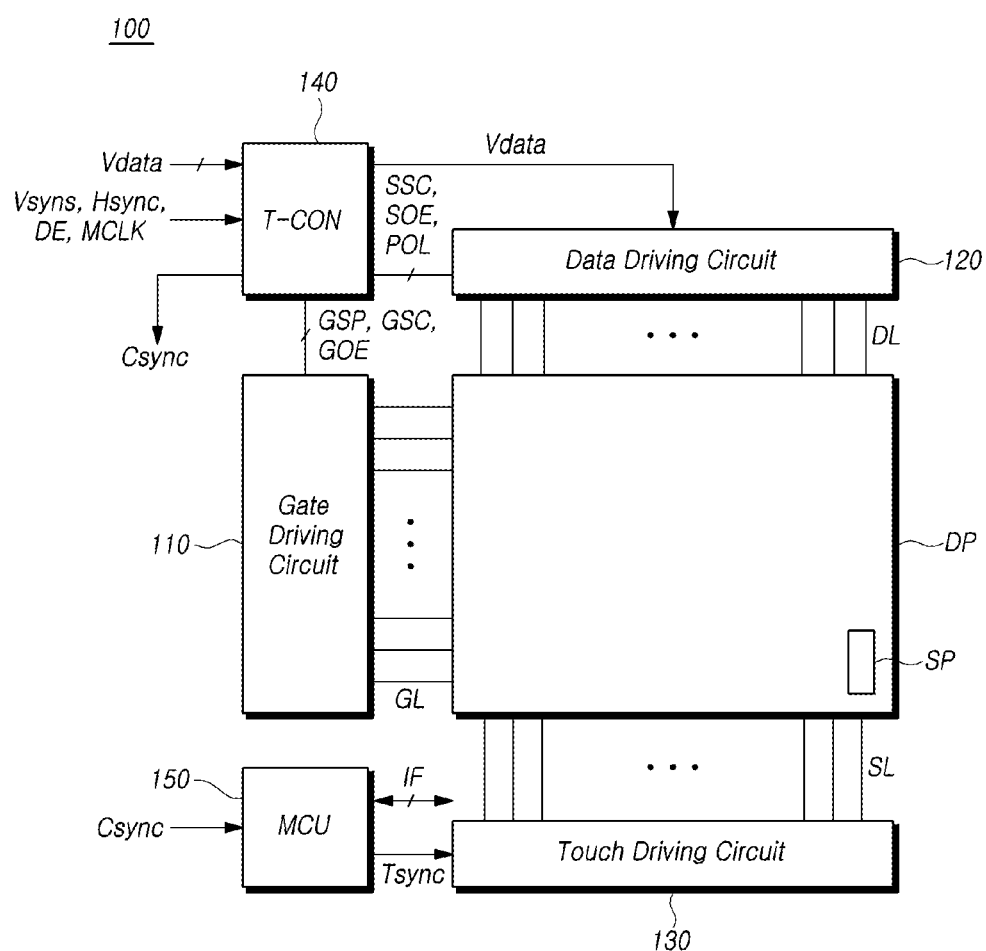
FIG. 1 is a block diagram illustrating a touch display device according to embodiments of the present disclosure.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description can make the subject matter in some embodiments of the present invention rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" can be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element can be included in at least one of two or more elements that "are connected or coupled to", "contact or overlap", etc. each other.

When time relative terms, such as "after", "subsequent to", "next", "before", and the like, are used to describe processes or operations of elements or configurations, or flows or steps in operating, processing, manufacturing methods, these terms can be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term "can" fully encompasses all the meanings of the term "can".

FIG. 1 is a block diagram illustrating a touch display device according to embodiments. All components of the touch display device according to all embodiments of the present disclosure are operatively coupled and configured.

Referring to FIG. 1, the touch display device according to embodiments can include a display panel DP, a gate driving circuit 110, a data driving circuit 120, a touch driving circuit 130, a timing controller (T-CON) 140, and a micro control unit (MCU) 150.

The display panel DP displays images on the basis of a gate signal transferred from the gate driving circuit 110 through gate lines GL and a data voltage Vdata transferred from the data driving circuit 120 through data lines DL.

The display panel DP includes a liquid crystal layer situated between two substrates, and can operate in any known mode, such as twisted nematic (TN) mode, vertical alignment (VA) mode, in-plane switching (IPS) mode, or fringe field switching (FFS) mode.

A plurality of subpixels SP of the display panel DP can be defined by a plurality of data lines DL and a plurality of gate lines GL. A single subpixel SP can include a thin-film transistor (TFT), a light-emitting element to be charged with the data voltage Vdata, a storage capacitor Cst electrically connected to the light-emitting element to maintain the voltage, and the like, all of which are provided in an area in which a single data line DL intersects a single gate line GL. The light-emitting element can be an organic light-emitting diode (OLED).

A black matrix, a color filter, and the like can be provided on the top substrate of the display panel DP, while TFTs, subpixels SP, common electrodes, and the like can be provided on the bottom substrate of the display panel DP. The display panel DP can be provided using a color-filter-on-TFT (COT) structure. In this case, the black matrix and the color filter can be provided on the bottom substrate of the display panel DP.

The common electrodes, to which a common voltage is supplied, can be provided on the top substrate or the bottom substrate of the display panel DP. Polarizers can be attached to the top substrate and the bottom substrate of the display panel DP, and alignment layers for setting the tilt angles of liquid crystal molecules can be provided on inner surfaces of the top and bottom substrates of the display panel DP in contact with the liquid crystal layer.

Column spacers for maintaining the cell gaps of liquid crystal cells are provided between the top substrate and the bottom substrate of the display panel DP. A backlight unit is disposed below the bottom surface of the bottom polarizer of the display panel DP. The backlight unit is implemented as an edge-lit backlight unit, a direct-lit backlight unit, or the like to illuminate the display panel DP.

Here, a touchscreen panel can have an incell touch structure by which a touchscreen panel can be embedded in a pixel array region of the display panel DP. The incell touchscreen panel uses electrodes or the like having the shape of blocks (or points), provided inside the display panel DP, as touch electrodes.

The timing controller 140 controls the gate driving circuit 110 and the data driving circuit 120. The timing controller 140 receives timing signals, such as a vertical synchronization signal Vsync, a horizontal synchronization signal Hsync, a data enable signal DE, and a main clock signal MCLK, as well as the data voltage Vdata corresponding to an image signal, from a host system.

The timing controller 140 controls the gate driving circuit 110 on the basis of scan timing control signals, such as a gate start pulse signal GSP, a gate shift clock signal GSC, and a gate output enable signal GOE. In addition, the timing controller 140 controls the data driving circuit 120 on the basis of data timing control signals, such as a source sampling clock signal SSC, a polarity control signal POL, and a source output enable signal SOE.

The gate driving circuit 110 sequentially drives the plurality of gate lines GL by sequentially supplying the gate signal to the display panel DP through the plurality of gate lines GL. Herein, the gate driving circuit 110 can also be referred to as a scan driving circuit or a gate driving integrated circuit (GDIC).

The gate driving circuit 110 can include one or more GDICs, which can be located on one or both sides of the display panel DP depending on the driving method. Alternatively, the gate driving circuit 110 can have a gate-in-panel structure in which the gate driving circuit 110 is embedded in a bezel area of the display panel DP.

The gate driving circuit 110 sequentially supplies the gate signal having an on or off voltage to the plurality of gate lines GL, under the control of the timing controller 140. In this regard, the gate driving circuit 110 can include a shift register, a level shifter, or the like.

The data driving circuit 120 drives the plurality of data lines DL by supplying the data voltage Vdata, received from the timing controller 140, to the plurality of data lines DL. Herein, the data driving circuit 120 can also be referred to as a source driving circuit or source driving integrated circuits (SDICs).

The data driving circuit 120 can include one or more source driving integrated circuits (SDICs). The source driving integrated circuit (SDIC) can be connected to bonding pads of the display panel DP by a tape-automated bonding (TAB) method or a chip-on-glass (COG) method or can be directly mounted on the display panel DP. In some cases, the source driving integrated circuit (SDIC) can be provided on the display panel DP as integrated portions of the display panel DP. In addition, the SDICs can be implemented using a chip-on-film (COF) structure. In this case, the SDICs can be mounted on a circuit film so as to be electrically connected to the data lines DL of the display panel DP via the circuit film.

When a specific gate line GL is turned on by the gate driving circuit 110, the data driving circuit 120 converts the data voltage Vdata, received from the timing controller 140, into an analog image data voltage, and supplies the analog image data voltage to the plurality of data lines DL.

The data driving circuit 120 can be located above or below (or on the upper or lower portion of) the display panel DP, or can be located above and below (or on both the upper and lower portions of) the display panel DP, depending on the driving method, the design, or the like.

The data driving circuit 120 can include a shift register, a latch circuit, a digital-to-analog converter (DAC), an output buffer, and the like. The digital-to-analog converter is a component for converting the data voltage Vdata, received from the timing controller 140, into an analog image data voltage to be supplied to the data lines DL.

The touch driving circuit 130 determines a touch event (i.e., whether or not the touchscreen panel has been touched) and a touch position on the display panel DP. The touch driving circuit 130 includes a driver circuit generating a touch driving signal to drive the touch electrodes and a sensing circuit sensing the touch electrodes and processing a touch sensing signal to determine the touch event and detect information regarding coordinates or the like. The driver circuit and the sensing circuit of the touch driving circuit 130 can be implemented as a single integrated circuit (IC) referred to as a readout integrated circuit (ROIC) or be provided as separate circuits divided according to the function.

Meanwhile, each of the source driving integrated circuit (SDIC) of the data driving circuit 120 can be combined with such a readout integrated circuit (ROIC) of the touch driving circuit 130 to form a combined integrated circuit also referred to as a source-readout integrated circuit (SRIC).

The touch driving circuit 130 can be provided on an outer substrate connected to the display panel DP. The touch driving circuit 130 is connected to the display panel DP via a plurality of sensing lines SL. The touch driving circuit 130 can determine the touch event and the touch position on the basis of a difference in capacitance among the touch electrodes in the display panel DP. For example, the touch driving circuit 130 determines the touch event and the touch position by detecting a difference in capacitance occurring between a location touched by a finger of a user and a location not touched by the finger. The touch driving circuit 130 generates a touch sensing voltage regarding the touch event and the touch position and transfers the touch sensing voltage to the micro control unit 150.

The micro-control unit (MCU) 150 controls the touch driving circuit 130. The micro control unit 150 can receive a control synchronization signal Csync from the timing controller 140 and generate, on the basis of the control synchronization signal, a touch synchronization signal Tsync by which the touch driving circuit 130 is controlled. The micro control unit 150 transmits and receives the touch sensing signal or the like to and from the touch driving circuit 130 via an interface IF defined in advance therebetween.

Here, the micro control unit 150 can be combined with the touch driving circuit 130 to form a touch control circuit comprised of a single IC, or can be combined with the timing controller 140 to form a control circuit comprised of a single IC.

In addition, the touch display device can further include a memory (MEM). The memory can temporarily store the data voltage Vdata output from the timing controller 140 and can output the data voltage Vdata to the data driving circuit 120 at preset points in time. The memory can be disposed inside or outside the data driving circuit 120. In a case in which the memory is disposed outside the data driving circuit 120, the memory can be disposed between the timing controller 140 and the data driving circuit 120. In addition, the memory can include a buffer memory storing the data voltage Vdata received from an external source and supplying the stored data voltage Vdata to the timing controller 140.

In addition, the touch display device 100 can further include an interface enabling the touch display device 100 to input and output signals to and from or to communicate with other external electronic devices or electronic components. For example, the interface can perform data communications via a serial peripheral interface (SPI), a low-voltage differential signaling (LVDS) interface, or a mobile industry processor interface (MIPI).

Figure 2:
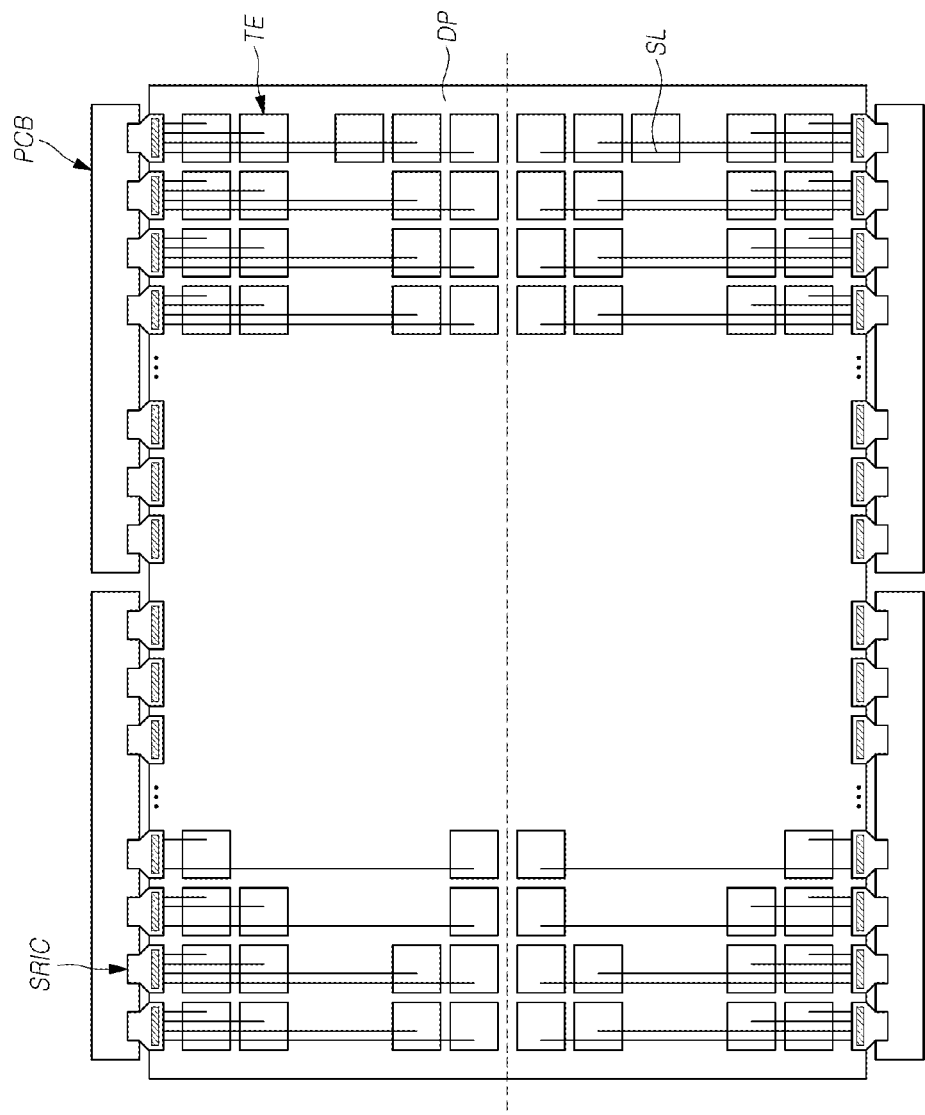
FIG. 2 is a block diagram illustrating the display panel in the touch display device according to embodiments of the present disclosure.

FIG. 2 is a block diagram illustrating the display panel in the touch display device according to embodiments.

Referring to FIG. 2, in the touch display device 100 according to embodiments, the display panel DP can provide not only an image display function, but also a touch sensing function for a passive stylus, such as a finger, and a pen touch sensing function (or a pen recognition function) for an active stylus.

The display panel DP can be various types of panels, such as a liquid crystal display panel or an organic light-emitting display panel.

In the display panel DP, the common electrodes generating an electric field together with pixel electrodes in response to a common voltage applied thereto during display driving period can be provided as a plurality of blocks to be used as a plurality of touch electrodes. In this case, the common electrodes can also mean the touch electrodes. Alternatively, the plurality of touch electrodes can be used as dedicated touch sensing electrodes (i.e., dedicated touch driving electrodes).

In another example, in a case in which the display panel DP is an organic light-emitting display panel, the touch display device 100 can include a first electrode, an organic light-emitting layer, a second electrode, an encapsulation layer located over the second electrode and having a sealing function, and a touch sensor metal layer located over the encapsulation layer of which an organic light-emitting diode (OLED) is comprised. A plurality of touch electrodes TE can be provided in the touch sensor metal layer.

In the following description, a case in which the plurality of touch electrodes TE serve as touch driving electrodes (i.e., touch sensors) during a touch sensing period and serve as common electrodes during display driving period will be taken for the sake of brevity.

The touch display device 100 can include the touch driving circuit 130 performing passive touch sensing and active touch sensing using a signal received via the display panel DP by driving the display panel DP.

The touch driving circuit 130 can include the readout integrated circuit (ROIC) receiving signals via the display panel DP by driving the display panel DP and a touch controller performing passive touch sensing (or finger touch sensing) and active touch sensing using the signals received via the display panel DP.

Such readout integrated circuits can be combined with the SDICs driving the data lines DL to form the combined integrated circuits SRIC.

The combined integrated circuits SRIC can have a chip-on-film (COF) structure in which the combined integrated circuits SRIC are mounted on a film or a chip-on-glass (COG) structure in which the combined integrated circuits SRIC are mounted on a sheet of glass. Although the combined integrated circuits SRIC will be described as having the COF structure, it will be apparent that the combined integrated circuits SRIC can also have the COG structure.

The film or glass on which the combined integrated circuits SRIC are mounted can be coupled to bonding pads of the display panel DP or bonding pads of printed circuit boards PCB, respectively.

A touch controller or the like can be mounted on each of the printed circuit boards PCB.

The readout integrated circuit (ROIC) and the source driving integrated circuit (SDIC) can be implemented as separate driving chips.

The combined integrated circuits SRIC can be electrically connected to the plurality of touch electrodes TE of the display panel DP through the plurality of sensing lines SL.

Here, the combined integrated circuits SRIC can perform the touch sensing operation during a touch sensing period separated from the display driving period in a time division manner. Touch sensing period in which the touch sensing is performed can be synchronous with the display driving period.

The touch display device 100 can perform load-free driving operation by which the effect of parasitic capacitance of the touch electrodes TE on the result of the touch sensing is reduced by supplying an alternating current (AC) load-free signal, the phase and amplitude of which are the same as those of the touch driving signal, to the data lines DL and the gate lines GL of the display panel during the touch sensing period.

Figure 3:
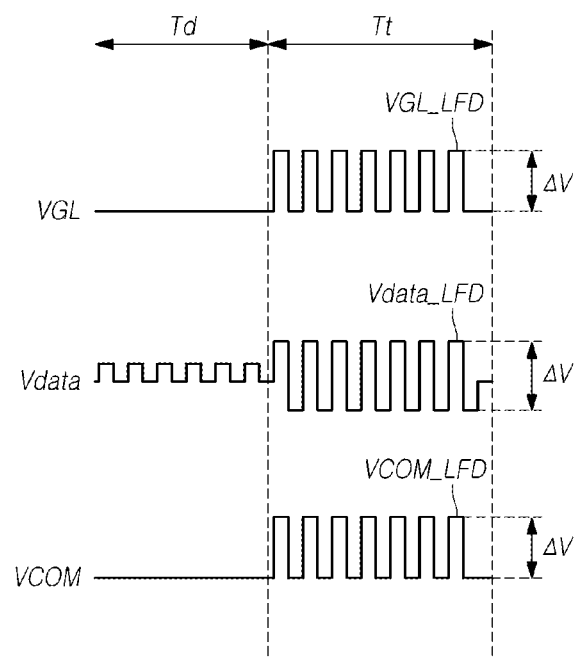
FIG. 3 is a waveform diagram illustrating a gate low voltage, a data voltage, and a common voltage in a case in which load-free driving is performed in the touch display device according to embodiments of the present disclosure.

FIG. 3 is a waveform diagram illustrating a gate low voltage, a data voltage, and a common voltage in a case in which the load-free driving is performed in the touch display device according to embodiments.

Referring to FIG. 3, in the touch display device 100 according to embodiments, the gate driving circuit 110 or the gate driving integrated circuit (GDIC) is driven in a predetermined range of driving voltage. The voltage level of the gate driving circuit 110 or the gate driving integrated circuit (GDIC) can be limited so that the driving is performed in the predetermined range of driving voltage. Here, the voltage level of the gate driving circuit 110 or the gate driving integrated circuit (GDIC) can be determined by the difference between a gate high voltage VGH and a gate low voltage VGL.

During display driving period Td, the gate driving circuit 110 can supply the gate high voltage VGH or the gate low voltage VGL having a predetermined level to the gate lines GL so that the display driving is performed reliably. In contrast, during a touch sensing period Tt, the gate driving circuit 110 generates the touch driving signal, i.e., a load-free gate low voltage VGL_LFD, the phase and amplitude of which are the same as those of a load-free common voltage VCOM_LFD, to be applied to the touch electrodes TE, and supplies the touch driving signal to the gate lines GL, thereby minimizing the effect of the parasitic capacitance.

In addition, the data driving circuit 120 supplies the data voltage Vdata received from the timing controller 140 to corresponding subpixels through the data lines DL during the display driving period Td, so that a designated color is displayed on the screen. In contrast, during the touch sensing period Tt, the data driving circuit 120 generates a load-free data voltage Vdata_LFD, the phase and amplitude of which are the same as those of the load-free common voltage VCOM_LFD, and supplies the load-free data voltage Vdata_LFD to the data lines DL, thereby minimizing the effect of the parasitic capacitance.

Here, the load-free common voltage VCOM_LFD, the load-free gate low voltage VGL_LFD, and the load-free data voltage Vdata_LFD supplied to the display panel DP during the touch sensing period Tt are load-free driving signals corresponding to AC signals respectively having a predetermined amplitude.

In a case in which the load-free common voltage VCOM_LFD is transferred from a touch power integrated circuit to the combined integrated circuits SRIC through signal lines having a physically-long path, the load-free common voltage VCOM_LFD is modified from an initial signal, due to the effect of a load (i.e., an RC delay) caused by a time delay, noise, and the like.

This phenomenon has an adverse effect on the realization of the purpose of reducing the load of the load-free driving, thereby lowering the signal-to-noise ratio (SNR) of a touch sensing output voltage transferred through the touch sensing signal. In addition, in a case in which an active stylus is used in the touch display device, the load-free common voltage VCOM_LFD can be deformed beyond the tolerance while being transferred to the display panel DP, and thus, the active stylus can fail to recognize the signal.

In addition, the path of transfer of the load-free common voltage VCOM_LFD can vary depending on the type of the touch display device, due to the number of the combined integrated circuits SRIC, the distances between the touch power integrated circuit generating the load-free common voltage VCOM_LFD and the combined integrated circuits SRIC, or the like. Thus, even in a case in which the same touch power integrated circuit is used, the magnitude of the load-free common voltage VCOM_LFD transferred can be different. Accordingly, the number of the touch power integrated circuits must be increased or the touch power integrated circuit must be separately developed according to the type of the touch display device, which is problematic.

Accordingly, the present disclosure can prevent the deformation of the signal and improve the performance of the touch sensing by generating the load-free common voltage VCOM_LFD by the combined integrated circuits SRIC.

Figure 4:
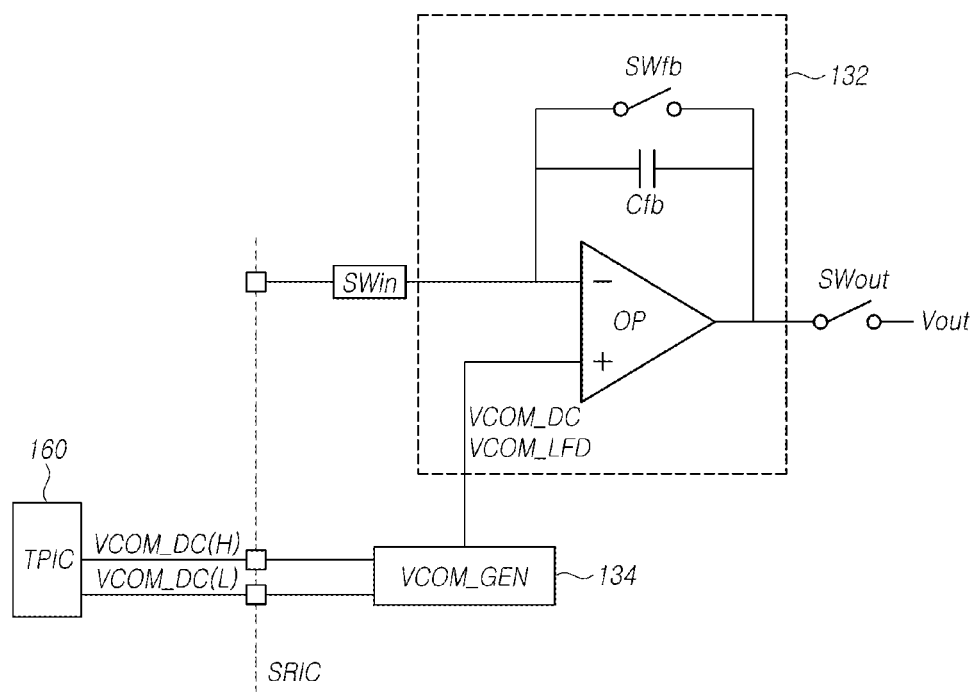
FIG. 4 is a diagram illustrating each of the combined integrated circuits of the touch display device according to embodiments of the present disclosure.

FIG. 4 is a diagram illustrating each of the combined integrated circuits of the touch display device according to embodiments.

Referring to FIG. 4, each of the combined integrated circuits SRIC of the touch display device 100 according to embodiments includes a load-free common voltage generating circuit 134 and a touch sensing circuit 132. The load-free common voltage generating circuit 134 is a circuit generating the load-free common voltage VCOM_LFD using a high-level direct current (DC) common voltage VCOM_DC(H) and a low-level DC common voltage VCOM_DC(L) transferred from a touch power integrated circuit (TPIC) 160. The touch sensing circuit 132 outputs the touch sensing output voltage Vout using the load-free common voltage VCOM_LFD generated by the load-free common voltage generating circuit 134 and the touch sensing signal TSS transferred from the display panel DP.

The combined integrated circuits SRIC according to the present disclosure can generate the touch driving signal using the high-level DC common voltage VCOM_DC(H) and the low-level DC common voltage VCOM_DC(L) transferred from the touch power integrated circuit. For example, the load-free common voltage generating circuit 134 can generate not only the load-free common voltage VCOM_LFD but also the touch driving signal necessary for the touch sensing. The touch driving signal of the touch display device 100 according to embodiments can be generated as the same signal as the load-free common voltage VCOM_LFD.

The load-free common voltage generating circuit 134 generates the load-free common voltage VCOM_LFD using the high-level DC common voltage VCOM_DC(H) and the low-level DC common voltage VCOM_DC(L) transferred from the touch power integrated circuit 160 and transfers the load-free common voltage VCOM_LFD and the DC common voltage VCOM_DC to the touch sensing circuit 132.

Meanwhile, each of the combined integrated circuits SRIC can include a source driving integrated circuit of the data driving circuit and a readout integrated circuit of the touch driving circuit 130. Thus, the load-free common voltage generating circuit 134 can be disposed in the source driving integrated circuit or in the readout integrated circuit, depending on the structure of the combined integrated circuit SRIC.

The term "combined integrated circuits SRIC" used herein can mean the touch driving circuit 130 or an integrated circuit formed by combining the touch driving circuit 130 with another driving circuit. Thus, a circuit including the combined integrated circuits SRIC can be referred to as the touch driving circuit 130.

The touch sensing circuit 132 is connected to corresponding touch electrodes among the plurality of touch electrodes TE of the display panel DP via an input switch SWin located between the touch sensing circuit 132 and the display panel DP, and outputs the touch sensing output voltage Vout via an output switch SWout.

The touch sensing circuit 132 includes an amplifier amplifying the touch sensing signal TSS transferred from the display panel DP. In addition, the touch sensing circuit 132 can further include an integrating circuit integrating the amplified signal and a sampling circuit selectively outputting the integrated signal. Although the following description will be focused on the touch sensing circuit 132 including an amplifier circuit, the same can be applied to a case in which an integrating circuit and a sampling circuit are provided.

The touch sensing circuit 132 can be connected to a first touch channel and can also be connected to a second touch channel adjacent to the first touch channel. In this case, the touch sensing circuit 132 can differentially receive a first touch sensing signal TSS input from the first touch channel and a second touch sensing signal TSS input from the second touch channel. The touch sensing circuit 132 generates the touch sensing output voltage Vout having a predetermined bit by detecting a change in the capacitance of the touch electrodes TE and outputs the touch sensing output voltage Vout via the output switch SWout.

The touch sensing circuit 132 connected to a specific touch channel in the combined integrated circuit SRIC is implemented as an operation amplifier OP. An inverting input terminal (−) of the operation amplifier OP can apply the touch driving signal to the display panel DP via the input switch SWin located between the touch sensing circuit 132 and the display panel DP or supply the DC common voltage VCOM_DC to the display panel DP via the input switch SWin.

The load-free common voltage VCOM_LFD or the DC common voltage VCOM_DC, transferred from the load-free common voltage generating circuit 134, is applied to a non-inverting input terminal (+) of the operation amplifier OP. Thus, the touch sensing circuit 132 supplies the DC common voltage VCOM_DC to the touch electrodes TE via the input switch SWin during the display driving period Td and supplies the load-free common voltage VCOM_LFD to the touch electrodes TE via the input switch SWin during the touch sensing period Tt.

A feedback capacitor Cfb and a feedback switch SWfb are connected in parallel between the inverting input terminal (−) and an output terminal of the operation amplifier OP. The touch sensing output voltage Vout of the operation amplifier OP can be accumulated by a predetermined times before being transferred to the micro control unit 150 via the output switch SWout.

Here, in a turned-on state of the feedback switch SWfb, the inverting input terminal (−) and the output terminal are short circuited, and thus, the touch sensing circuit 132 serves as a buffer. In a turned-off state of the feedback switch SWfb, the touch sensing circuit 132 serves as an amplifier amplifying the touch sensing signal TSS through the feedback capacitor Cfb.

The input switch SWin serves to transfer the touch sensing signal TSS, generated in the display panel DP, to the touch sensing circuit 132 or transfer the load-free common voltage VCOM_LFD or the DC common voltage VCOM_DC to the display panel DP, in response to a control signal.

The output switch SWout is turned on in a time segment in which the touch sensing circuit 132 generates the touch sensing output voltage Vout using the touch sensing signal TSS received from the display panel DP in response to a control signal, thereby allowing the touch sensing output voltage Vout to be transferred to the micro control unit 150.

Figure 5:
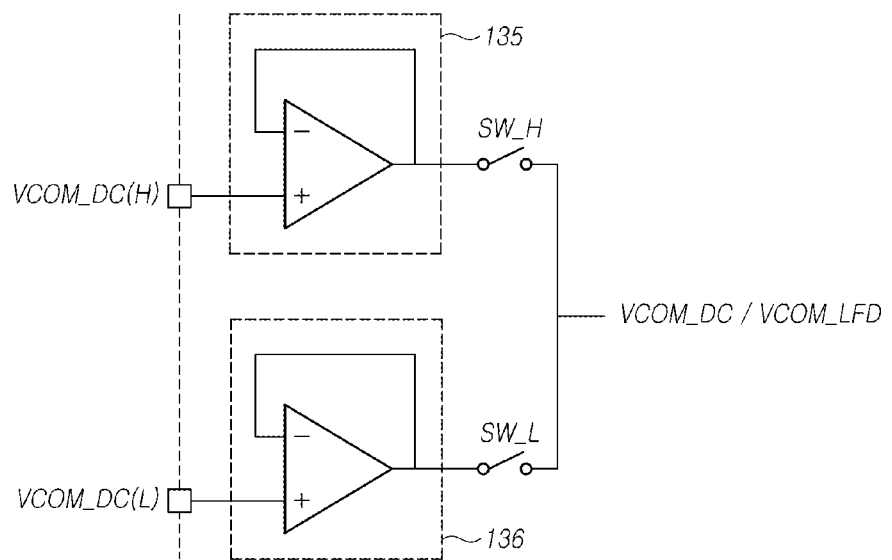
FIG. 5 is a diagram illustrating the load-free common voltage generating circuit provided in the combined integrated circuit of the touch display device according to embodiments of the present disclosure.

FIG. 5 is a diagram illustrating the load-free common voltage generating circuit provided in the combined integrated circuit of the touch display device according to embodiments.

Referring to FIG. 5, in the touch display device 100 according to embodiments, the load-free common voltage generating circuit 134 provided in the combined integrated circuit SRIC includes a first buffer 135 and a second buffer 136. The first buffer 135 is a buffer circuit receiving the high-level DC common voltage VCOM_DC(H). The second buffer 136 is a buffer circuit receiving the low-level DC common voltage VCOM_DC(L). The first buffer 135 and the second buffer 136 transfer output signals under the control of a high-level switch SW_H and a low-level switch SW_L, respectively.

The first buffer 135 is an operation amplifier receiving the high-level DC common voltage VCOM_DC(H) via a non-inverting input terminal (+) thereof, with an output terminal thereof being connected to an inverting input terminal (−) thereof.

The second buffer 136 is an operation amplifier receiving the low-level DC common voltage VCOM_DC(L) via a non-inverting input terminal (+) thereof, with an output terminal thereof being connected to an inverting input terminal (−) thereof.

Accordingly, the load-free common voltage generating circuit 134 can generate the load-free common voltage VCOM_LFD toggling between the high-level DC common voltage VCOM_DC(H) and the low-level DC common voltage VCOM_DC(L), in response to the operation of the high-level switch SW_H connected to the output terminal of the first buffer 135 and the operation of the low-level switch SW_L connected to the output terminal of the second buffer 136.

Figure 6:
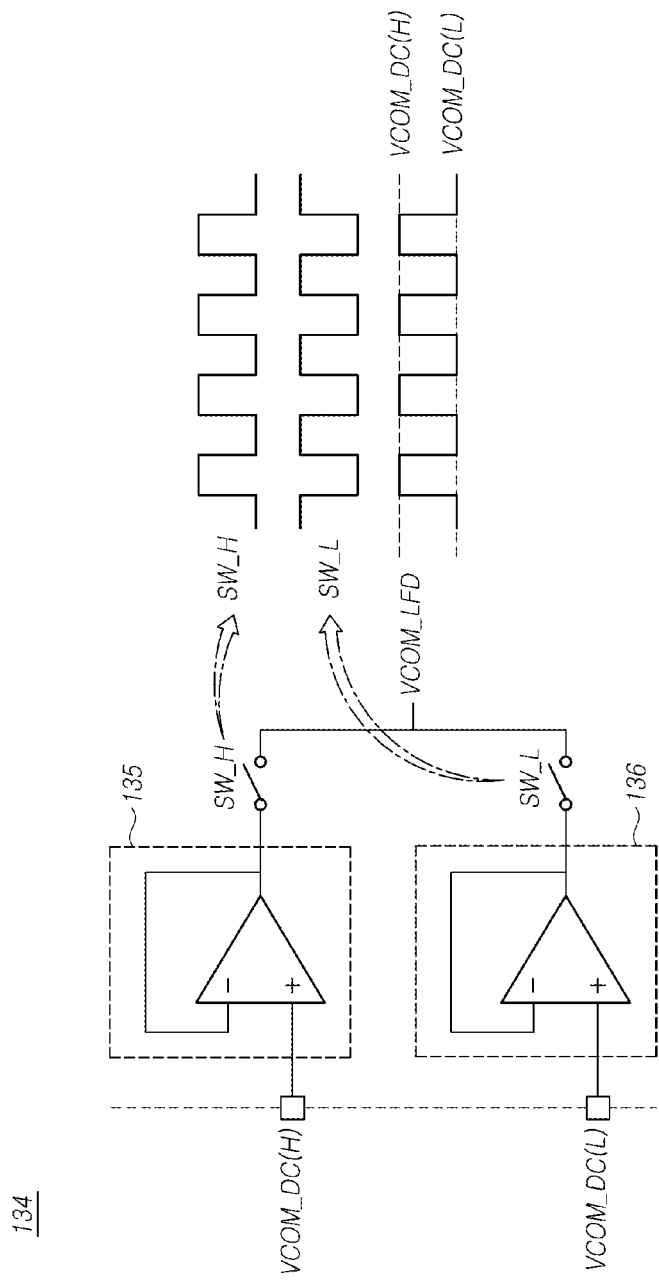
FIG. 6 is a diagram illustrating a case in which the load-free common voltage generating circuit provided in the combined integrated circuit of the touch display device according to embodiments of the present disclosure generates a load-free common voltage.
Figure 7:
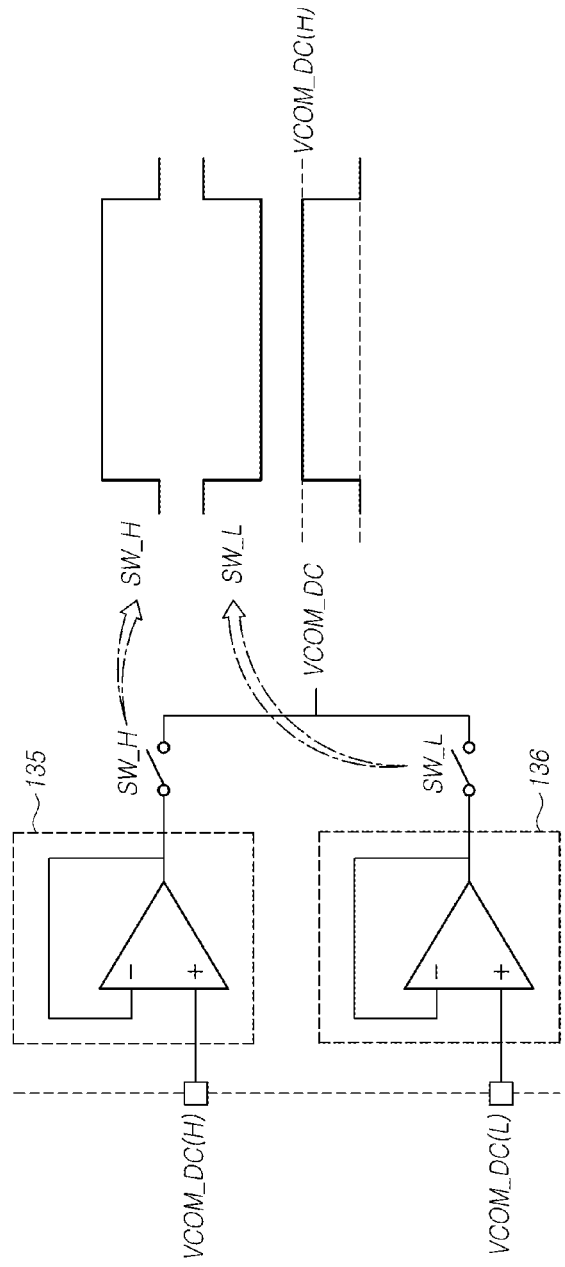
FIG. 7 is a diagram illustrating a case in which the load-free common voltage generating circuit provided in the combined integrated circuit of the touch display device according to embodiments of the present disclosure transfers a high-level DC common voltage.

FIG. 6 is a diagram illustrating a case in which the load-free common voltage generating circuit provided in the combined integrated circuit of the touch display device according to embodiments generates a load-free common voltage, while FIG. 7 is a diagram illustrating a case in which the load-free common voltage generating circuit provided in the combined integrated circuit of the touch display device according to embodiments transfers a high-level DC common voltage.

First, referring to FIG. 6, in the touch display device 100 according to embodiments, the first buffer 135 of the load-free common voltage generating circuit 134 transfers the high-level DC common voltage VCOM_DC(H), while the second buffer 136 of the load-free common voltage generating circuit 134 transfers the low-level DC common voltage VCOM_DC(L). Thus, when the first buffer 135 and the second buffer 136 are alternately driven, the load-free common voltage VCOM_LFD toggling between the high-level DC common voltage VCOM_DC(H) and the low-level DC common voltage VCOM_DC(L) can be generated.

Accordingly, the load-free common voltage generating circuit 134 can transfer the load-free common voltage VCOM_LFD toggling between the high-level DC common voltage VCOM_DC(H) and the low-level DC common voltage VCOM_DC(L) to the touch sensing circuit 132 by applying opposite pulses to the high-level switch SW_H connected to the output terminal of the first buffer 135 and the low-level switch SW_L connected to the output terminal of the second buffer 136.

In contrast, as illustrated in FIG. 7, in a case in which the load-free common voltage generating circuit 134 turns on one of the first buffer 135 and the second buffer 136 and turns off the other of the first buffer 135 and the second buffer 136, the DC common voltage VCOM_DC is output.

For example, in a case in which the high-level switch SW_H connected to the output terminal of the first buffer 135 receiving the high-level DC common voltage VCOM_DC(H) is maintained in the turned-on state and the low-level switch SW_L connected to the output terminal of the second buffer 136 receiving the low-level DC common voltage VCOM_DC(L) is maintained in the turned-off state, the high-level DC common voltage VCOM_DC(H) can be output from the load-free common voltage generating circuit 134 to be transferred to the touch sensing circuit 132.

In addition, the touch display device 100 according to the present disclosure can control the touch sensing circuit 132 to serve as a buffer in a time segment in which the load-free common voltage VCOM_LFD is applied to the display panel DP, such that a plurality of multiplexers (MUXs) disposed between the combined integrated circuits SRIC and the display panel DP can be substituted with a single input switch SWin, thereby reducing the overall size.

Figure 8:
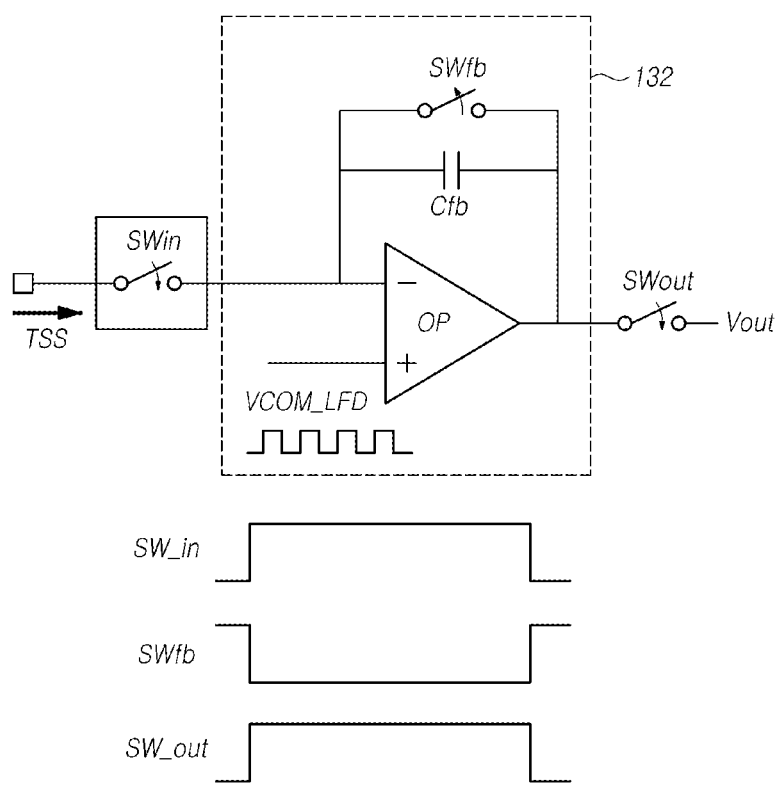
FIG. 8 is an example diagram illustrating a switch operation in a process of receiving a touch sensing signal from the display panel in the touch display device according to embodiments of the present disclosure.
Figure 9:
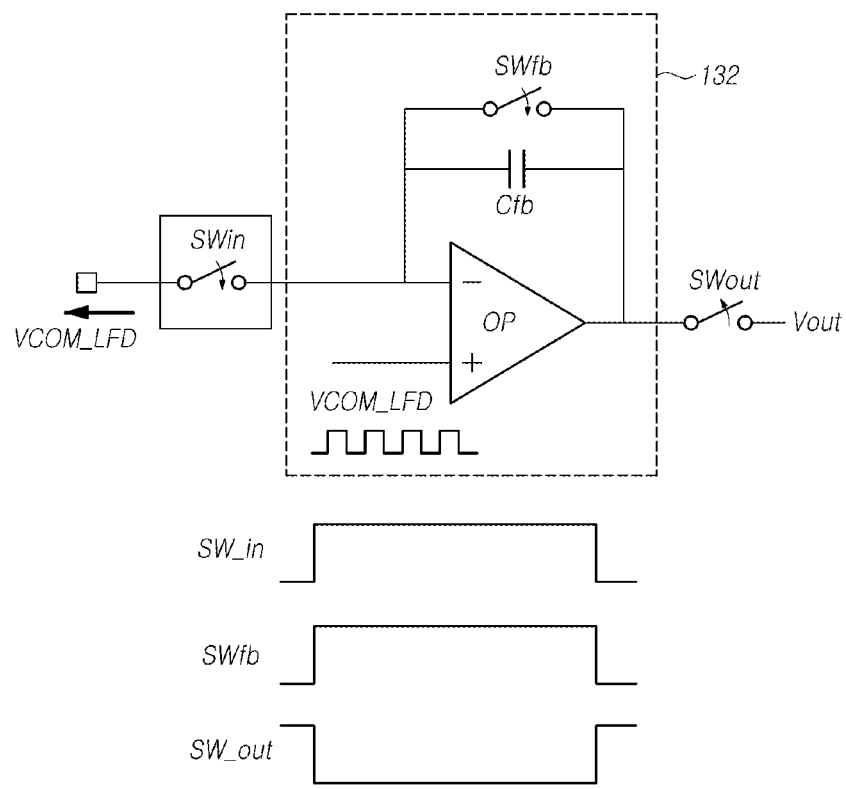
FIG. 9 is an example diagram illustrating a switch operation in a process of supplying a load-free common voltage to the display panel by the touch sensing circuit in the touch display device according to embodiments of the present disclosure.

FIG. 8 is an example diagram illustrating a switch operation in a process of receiving a touch sensing signal from the display panel in the touch display device according to embodiments, while FIG. 9 is an example diagram illustrating a switch operation in a process of supplying a load-free common voltage to the display panel by the touch sensing circuit.

First, referring to FIG. 8, in the touch display device 100 according to embodiments, the touch sensing circuit 132 can serve as an amplifier circuit or a buffer circuit, under the control of the feedback switch SWfb connected between the inverting input terminal (−) and the output terminal of the operation amplifier OP.

For example, in a case in which the input switch SWin is turned on and the feedback switch SWfb connected between the inverting input terminal (−) and the output terminal of the operation amplifier OP is turned off, the touch sensing circuit 132 serves as an amplifier circuit to amplify the touch sensing signal TSS transferred from the display panel DP using the load-free common voltage VCOM_LFD as a reference value and transfer the amplified touch sensing signal TSS to the output terminal through the feedback capacitor Cfb, so that the touch sensing output voltage Vout is supplied to the micro control unit 150.

In a case in which the touch sensing circuit 132 serves as an amplifier circuit as described above, the input switch SWin connected between the display panel DP and the touch sensing circuit 132 is maintained in the turned-on state, and the output switch SWout connected to the output terminal of the touch sensing circuit 132 is maintained in the turned-on state.

In contrast, as illustrated in FIG. 9, the touch sensing circuit 132 can serve as a buffer circuit, under the control of the feedback switch SWfb connected between the inverting input terminal (−) and the output terminal of the operation amplifier OP.

For example, when the input switch SWin is turned on and the feedback switch SWfb connected between the inverting input terminal (−) and the output terminal of the operation amplifier OP is turned on, the touch sensing circuit 132 serves as a buffer circuit. Thus, the load-free common voltage VCOM_LFD formed on the inverting input terminal (−) of the operation amplifier OP is supplied to the touch electrodes TE of the display panel DP via the input switch SWin.

Here, since a voltage charged in the feedback capacitor Cfb is reset when the feedback switch SWfb is turned on, the touch sensing circuit 132 also serves as a reset switch.

As described above, in a case in which the touch sensing circuit 132 serves as a buffer circuit, the input switch SWin connected between the display panel DP and the touch sensing circuit 132 is maintained in the turned-on state, and the output switch SWout connected to the output terminal of the touch sensing circuit 132 is maintained in the turned-off state.

As described above, the touch sensing circuit 132 can be controlled to serve as an amplifier circuit or a buffer circuit by controlling the input switch SWin connected to the input terminal of the touch sensing circuit 132, the output switch SWout connected to the output terminal of the touch sensing circuit 132, and the feedback switch SWfb connected between the inverting input terminal (−) and the output terminal of the operation amplifier OP. Thus, a plurality of multiplexers disposed between the combined integrated circuit SRIC and the display panel DP can be substituted with a single input switch SWin, thereby reducing the overall size.

Figure 10:
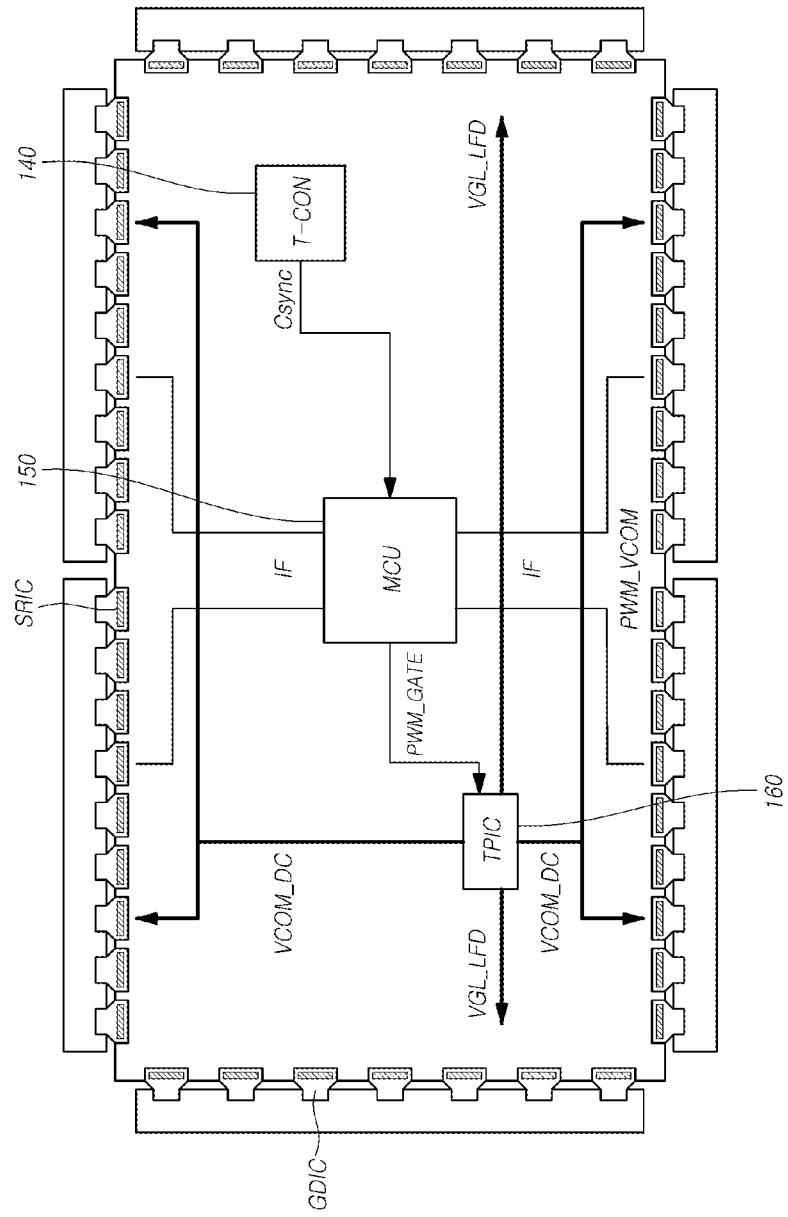
FIG. 10 is a block diagram illustrating a case in which the combined integrated circuits of the touch display device according to embodiments of the present disclosure generate a load-free common voltage.

FIG. 10 is a block diagram illustrating a case in which the combined integrated circuits of the touch display device according to embodiments generate a load-free common voltage.

Referring to FIG. 10, in the touch display device 100 according to embodiments, the touch driving circuit 130 generates the load-free common voltage VCOM_LFD using the DC common voltage VCOM_DC supplied by the touch power integrated circuit 160, applies the load-free common voltage VCOM_LFD to the display panel DP during the touch sensing period Tt, and performs the touch sensing using the touch sensing signal TSS received from the display panel DP. The touch driving circuit 130 can be provided in the form of readout integrated circuits. The plurality of combined integrated circuits SRIC can be provided by combining the source driving integrated circuits driving the data lines with the readout integrated circuits.

The micro control unit 150 can receive a control synchronization signal Csync from the timing controller 140 and generate, on the basis of the control synchronization signal Csync, a touch synchronization signal Tsync by which the combined integrated circuits SRIC is controlled.

In addition, the micro control unit 150 transmits and receives pulse-width modulated signals PWM_VCOM, the touch sensing signal TSS, and the like to and from the combined integrated circuits SRIC via an interface IF defined in advance therebetween.

The touch power integrated circuit 160 generates the load-free gate low voltage VGL_LFD applied to the gate driving integrated circuits GDIC during the touch sensing period Tt using the pulse-width modulated signal PWM_GATE transferred from the micro control unit 150 in synchronization with the load-free driving.

Here, the touch power integrated circuit 160 can supply the DC common voltage VCOM_DC to the combined integrated circuits SRIC, thereby allowing the combined integrated circuits SRIC to generate the load-free common voltage VCOM_LFD. Here, the combined integrated circuits SRIC can use the pulse-width modulated signal PWM_VCOM received from the micro control unit 150 so that the load-free common voltage VCOM_LFD is synchronized with the touch driving signal TDS.

Thus, the combined integrated circuits SRIC can perform the touch sensing operation using the internally-generated load-free common voltage VCOM_LFD, and the gate driving integrated circuits GDIC can perform the driving for the display panel DP using the load-free gate low voltage VGL_LFD supplied from the touch power integrated circuit 160.

Here, the micro control unit 150, the touch power integrated circuit 160, and the timing controller 140 can be mounted on a control printed circuit board (CPCB).

The control printed circuit board (CPCB) can be electrically connected to a source printed circuit board (SPCB) through a cable. The source printed circuit board (SPCB)

can be electrically connected to the display panel DP by, for example, a chip-on-film (COF) method. In a case in which the display panel DP is small, the control printed circuit board (CPCB) and the source printed circuit board (SPCB) can be combined together to form a single circuit board.

The micro control unit 150 controls the transfer of signals to and from each of the plurality of combined integrated circuits SRIC via the interface IF.

In addition, the touch display device 100 according to the present disclosure can generate the load-free gate low voltage VGL_LFD by the gate driving integrated circuits GDIC, thereby preventing signal distortion and improving the performance of the touch sensing.

Figure 11:
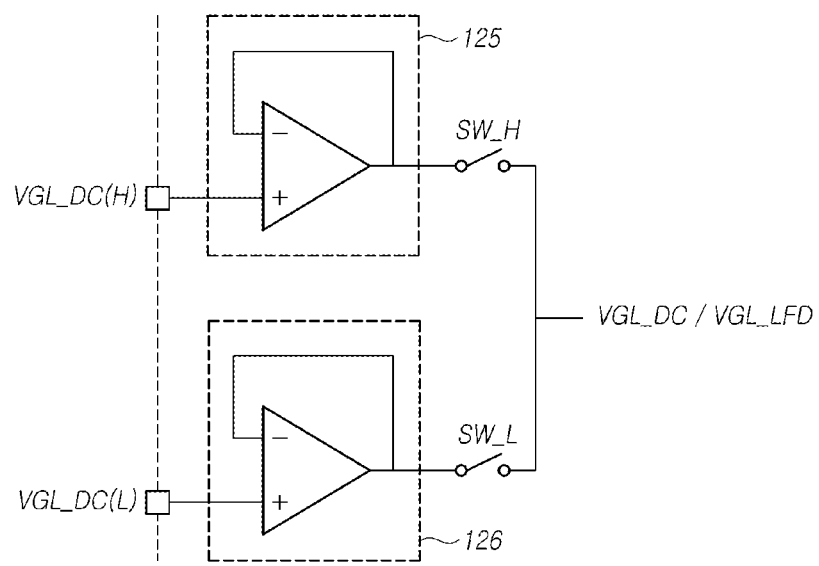
FIG. 11 is an example diagram illustrating a load-free gate low voltage generating circuit provided in each of the gate driving integrated circuits of the touch display device according to embodiments of the present disclosure.

FIG. 11 is an example diagram illustrating a load-free gate low voltage generating circuit provided in each of the gate driving integrated circuits of the touch display device according to embodiments.

Referring to FIG. 11, in the touch display device 100 according to embodiments, a load-free gate low voltage generating circuit 124 is provided in each of the gate driving integrated circuits GDIC. The load-free gate low voltage generating circuit 124 includes a first buffer 125 receiving a high-level DC gate low voltage VGL_DC(H) and a second buffer 126 receiving a low-level DC gate low voltage VGL_DC(L). The first buffer 125 and the second buffer 126 transfer the gate low voltage VGL_DC or the load-free gate low voltage VGL_LFD under the control of the high-level switch SW_H and the low-level switch SW_L.

The first buffer 125 is an operation amplifier receiving the high-level DC gate low voltage VGL_DC(H) through a non-inverting input terminal (+) thereof, with an inverting input terminal (−) thereof being connected to an output terminal thereof.

The second buffer 126 is an operation amplifier receiving the low-level DC gate low voltage VGL_DC(L) through a non-inverting input terminal (+) thereof, with an inverting input terminal (−) thereof being connected to an output terminal thereof.

Accordingly, the load-free gate low voltage generating circuit 124 can generate the load-free gate low voltage VGL_LFD toggling between the high-level DC gate low voltage VGL_DC(H) and the low-level DC gate low voltage VGL_DC(L), in response to the operation of the high-level switch SW_H connected to the output terminal of the first buffer 125 and the operation of the low-level switch SW_L connected to the output terminal of the second buffer 126.

Figure 12:
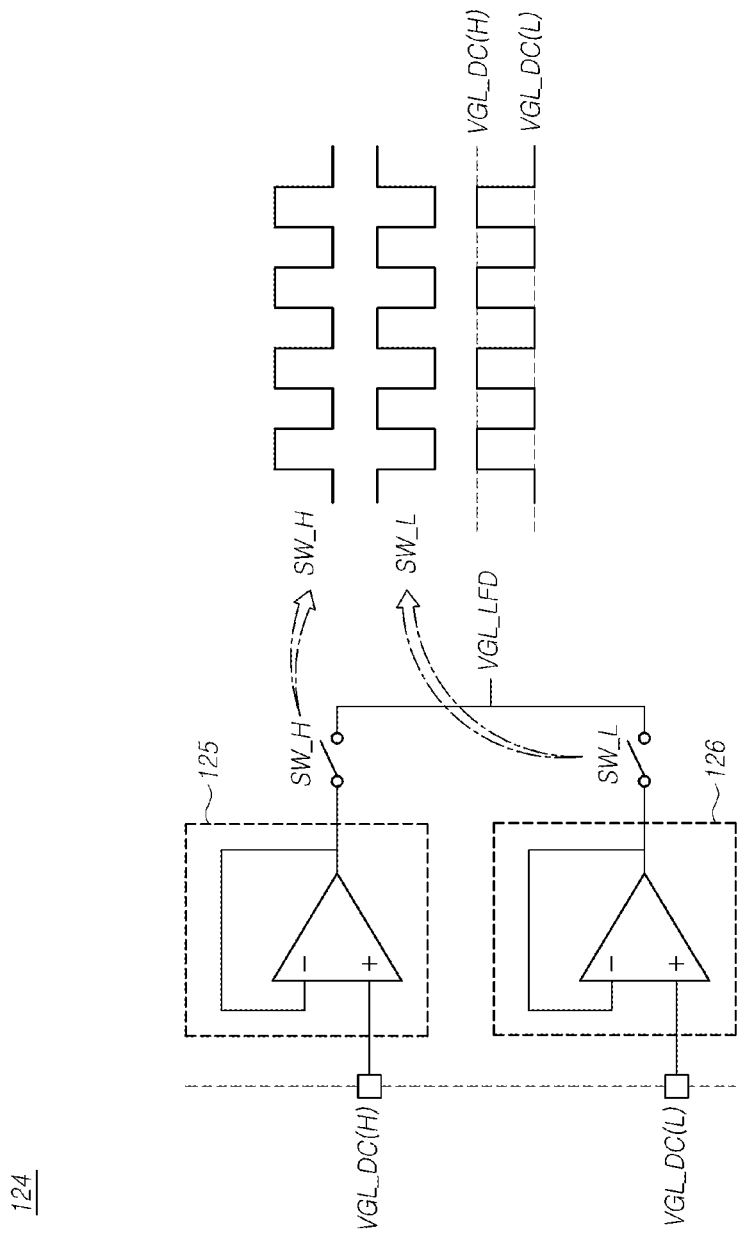
FIG. 12 is a diagram illustrating a case in which the load-free gate low voltage generating circuit provided in the gate driving integrated circuit of the touch display device according to embodiments of the present disclosure generates a load-free gate low voltage.
Figure 13:
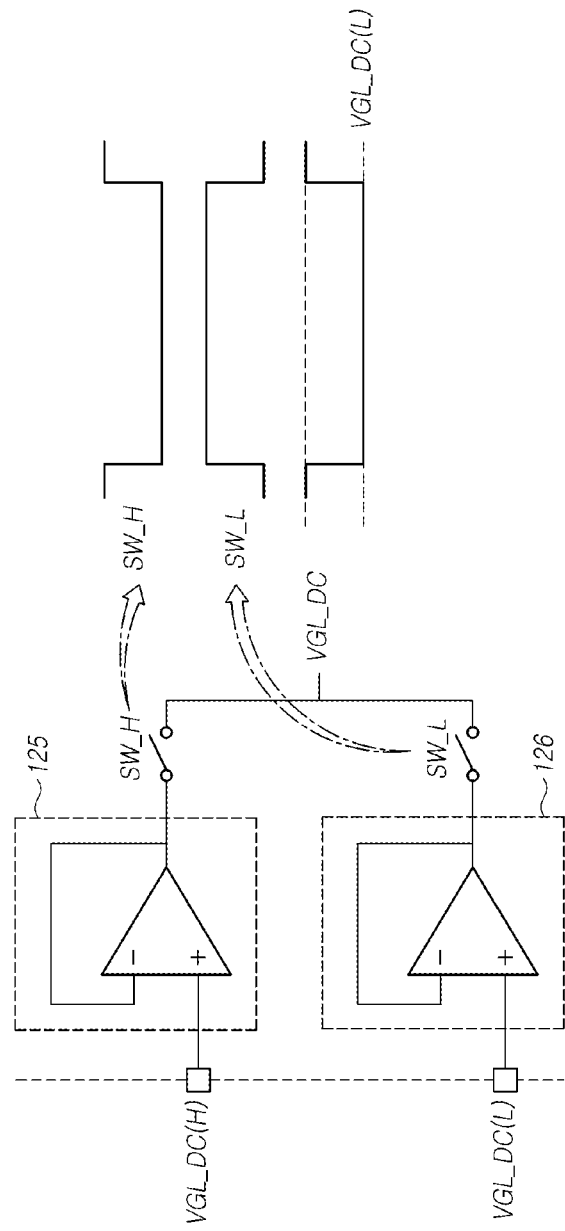
FIG. 13 is a diagram illustrating a case in which the load-free gate low voltage generating circuit provided in the gate driving integrated circuit of the touch display device according to embodiments of the present disclosure generates a high-level DC gate low voltage.

FIG. 12 is a diagram illustrating a case in which the load-free gate low voltage generating circuit provided in the gate driving integrated circuit of the touch display device according to embodiments generates a load-free gate low voltage, while FIG. 13 is a diagram illustrating a case in which the load-free gate low voltage generating circuit provided in the gate driving integrated circuit of the touch display device according to embodiments generates a high-level DC gate low voltage.

First, referring to FIG. 12, in the touch display device 100 according to embodiments, the first buffer 125 of the load-free gate low voltage generating circuit 124 transfers the high-level DC gate low voltage VGL_DC(H), and the second buffer 126 of the load-free gate low voltage generating circuit 124 transfers the low-level DC gate low voltage VGL_DC(L). Thus, when the first buffer 125 and the second buffer 126 are alternately driven, the load-free gate low voltage VGL_LFD toggling between the high-level DC gate low voltage VGL_DC(H) and the low-level DC gate low voltage VGL_DC(L) can be generated.

Accordingly, the load-free gate low voltage generating circuit 124 can supply the load-free gate low voltage VGL_LFD toggling between the high-level DC gate low voltage VGL_DC(H) and the low-level DC gate low voltage VGL_DC(L) through the gate lines GL by applying opposite pulses to the high-level switch SW_H connected to the output terminal of the first buffer 125 and the low-level switch SW_L connected to the output terminal of the second buffer 126.

In contrast, as illustrated in FIG. 13, in a case in which the load-free gate low voltage generating circuit 124 turns on one of the first buffer 125 and the second buffer 126 and turns off the other of the first buffer 125 and the second buffer 126, the DC gate low voltage VGL_DC is output.

For example, in a case in which the high-level switch SW_H connected to the output terminal of the first buffer 125 receiving the high-level DC gate low voltage VGL_DC(H) is maintained in the turned-on state and the low-level switch SW_L connected to the output terminal of the second buffer 126 receiving the low-level DC gate low voltage VGL_DC(L) is maintained in the turned-off state, the high-level DC gate low voltage VGL_DC(H) can be output from the load-free gate low voltage generating circuit 124.

Here, simultaneously with the combined integrated circuit SRIC generating the load-free common voltage VCOM_LFD, the gate driving integrated circuits GDIC can generate the load-free gate low voltage VGL_LFD.

Figure 14:
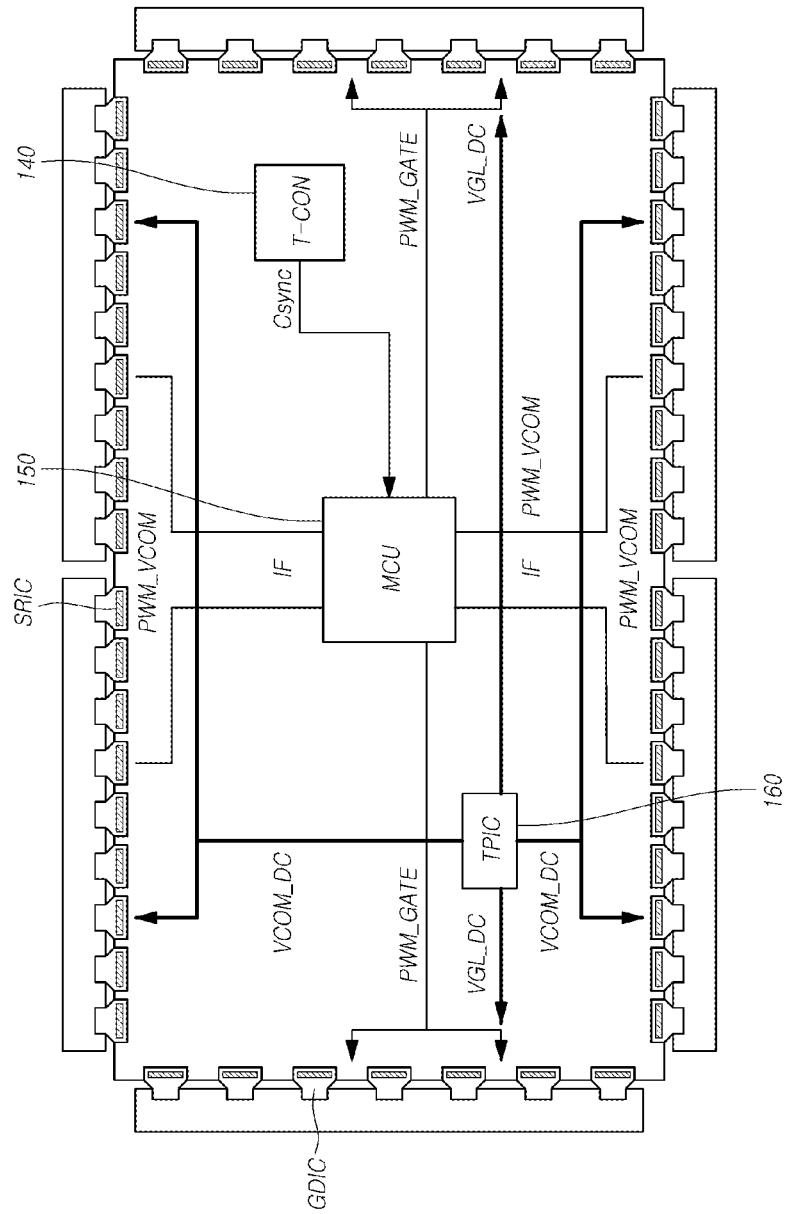
FIG. 14 is a block diagram illustrating a case in which the combined integrated circuits and the gate driving integrated circuits of the touch display device according to embodiments of the present disclosure respectively generate a load-free common voltage.

FIG. 14 is a block diagram illustrating a case in which the combined integrated circuits and the gate driving integrated circuits of the touch display device according to embodiments respectively generate a load-free common voltage.

Referring to FIG. 14, in the touch display device 100 according to embodiments, the touch driving circuit 130 performing the touch sensing using the touch sensing signal TSS received from the display panel DP can be provided in the form of readout integrated circuits, and the plurality of combined integrated circuits SRIC can be provided by combining the source driving integrated circuits driving the data lines with the readout integrated circuits. The gate driving circuit 110 sequentially driving the plurality of gate lines GL by sequentially supplying the gate signal to the display panel DP through the plurality of gate lines GL can be provided in the form of the gate driving integrated circuits GDIC.

The combined integrated circuits SRIC generate the load-free common voltage VCOM_LFD using the DC common voltage VCOM_DC supplied by the touch power integrated circuit 160 and apply the load-free common voltage VCOM_LFD to the touch electrodes TE of the display panel DP during the touch sensing period Tt.

The gate driving integrated circuits GDIC generate the load-free gate low voltage VGL_LFD using the DC gate low voltage VGL_DC supplied by the touch power integrated circuit 160, and during the touch sensing period Tt, apply the load-free gate low voltage VGL_LFD to the display panel DP through the gate lines GL.

The micro control unit 150 can receive the control synchronization signal Csync from the timing controller 140 and generate, on the basis of the control synchronization signal Csync, the touch synchronization signal Tsync by which the combined integrated circuits SRIC is controlled.

In addition, the micro control unit 150 transmits and receives the DC common voltage VCOM_DC, the touch sensing signal TSS, and the like to and from the combined integrated circuits SRIC via the interface IF defined in advance therebetween. The micro control unit 150 also transmits and receives pulse-width modulated signal PWM- _GATE and the like to and from the gate driving integrated circuits GDIC via an interface IF defined in advance therebetween.

Here, the touch power integrated circuit 160 can supply the DC common voltage VCOM_DC to the combined integrated circuits SRIC, thereby allowing the combined integrated circuits SRIC to generate the load-free common voltage VCOM_LFD, and supply the DC gate low voltage VGL_DC to the gate driving integrated circuits GDIC, thereby allowing the gate driving integrated circuits GDIC to generate the load-free gate low voltage VGL_LFD.

Here, the combined integrated circuits SRIC can use the pulse-width modulated signal PWM_VCOM received from the micro control unit 150 so that the load-free common voltage VCOM_LFD is synchronized with the touch driving signal TDS and the gate driving integrated circuits GDIC can use the pulse-width modulated signal PWM_GATE received from the micro control unit 150 so that the load-free gate low voltage VGL_LFD is synchronized with the touch driving signal TDS.

Accordingly, the combined integrated circuits SRIC can perform the touch sensing operation using the internally-generated load-free common voltage VCOM_LFD, while the gate driving integrated circuits GDIC can drive the display panel DP using the internally-generated load-free gate low voltage VGL_LFD.

Here, the micro control unit 150, the touch power integrated circuit 160, and the timing controller 140 can be mounted on the control printed circuit board (CPCB).

The control printed circuit board (CPCB) can be electrically connected to the source printed circuit board (SPCB) through the cable, while the SPCB and the display panel DP can be electrically connected by the chip-on-film (COF) method. In a case in which the display panel DP is a small display panel, the control printed circuit board (CPCB) can be combined with the source printed circuit board (SPCB) to form a single circuit board.

The micro control unit 150 controls the transfer of signals to and from each of the plurality of combined integrated circuits SRIC via the interface IF and each of the plurality of gate driving integrated circuits GDIC via the interface IF.

In addition, the touch display device 100 according to the present disclosure can generate the load-free gate low voltage VGL_LFD by adjusting the level of the load-free common voltage VCOM_LFD generated by the combined integrated circuits SRIC or generate the load-free common voltage VCOM_LFD by adjusting the level of the load-free gate low voltage VGL_LFD generated by the gate driving integrated circuits GDIC.

Figure 15:
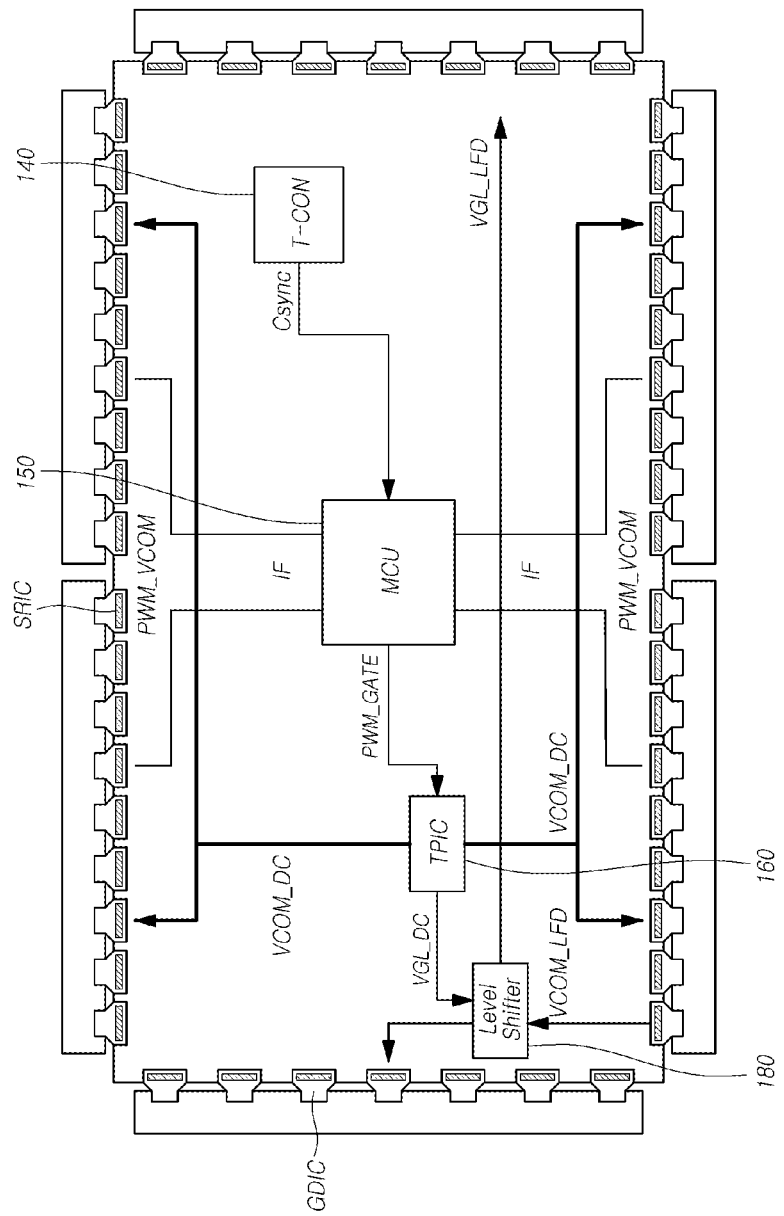
FIG. 15 is a block diagram illustrating a case of generating a load-free gate low voltage by changing the level of a load-free common voltage generated by the combined integrated circuits in the touch display device according to embodiments of the present disclosure.

FIG. 15 is a block diagram illustrating a case of generating a load-free gate low voltage by changing the level of a load-free common voltage generated by the combined integrated circuits in the touch display device according to embodiments.

Referring to FIG. 15, in the touch display device 100 according to embodiments, the touch driving circuit 130 performing the touch sensing using the touch sensing signal TSS received from the display panel DP can be provided in the form of readout integrated circuits, and the plurality of combined integrated circuits SRIC can be provided by combining the source driving integrated circuits driving the data lines with the readout integrated circuits. The gate driving circuit 110 sequentially driving the plurality of gate lines GL by sequentially supplying the gate signal to the display panel DP through the plurality of gate lines can be provided in the form of the gate driving integrated circuits GDIC.

Here, the combined integrated circuits SRIC generates the load-free common voltage VCOM_LFD using the DC common voltage VCOM_DC supplied by the touch power integrated circuit 160, applies the load-free common voltage VCOM_LFD to the display panel DP during the touch sensing period Tt, and performs the touch sensing using the touch sensing signal TSS received from the display panel DP.

The micro control unit 150 can receive the control synchronization signal Csync from the timing controller 140 and generate, on the basis of the received control synchronization signal Csync, the touch synchronization signal Tsync by which the combined integrated circuits SRIC is controlled.

In addition, the micro control unit 150 transmits and receives the common voltage VCOM to and from the combined integrated circuits SRIC via the interface IF defined therebetween.

Here, the load-free gate low voltage VGL_LFD used in the gate driving integrated circuits GDIC during the touch sensing period Tt has the same phase as the load-free common voltage VCOM_LFD, and thus, can be generated by adjusting the level of the load-free common voltage VCOM_LFD.

Accordingly, a level shifter 180 generating the load-free gate low voltage VGL_LFD by shifting the level of the load-free common voltage VCOM_LFD transferred from the combined integrated circuits SRIC can be further provided.

Here, the DC gate low voltage VGL_DC generated by the touch power integrated circuit 160 can be used so that the load-free gate low voltage VGL_LFD generated by the level shift 180 is synchronized with the load-free common voltage VCOM_LFD.

In addition, the combined integrated circuits SRIC can use the pulse-width modulated signal PWM_VCOM by receiving the pulse-width modulated signal PWM_VCOM from the micro control unit 150 so that the load-free common voltage VCOM_LFD is synchronized with the touch driving signal TDS.

Accordingly, the combined integrated circuits SRIC can perform the touch sensing operation using the internally-generated load-free common voltage VCOM_LFD, and the gate driving integrated circuits GDIC can drive the display panel DP using the load-free gate low voltage VGL_LFD supplied via the level shifter 180.

Here, the micro control unit 150, the touch power integrated circuit 160, and the timing controller 140 can be mounted on the control printed circuit board (CPCB).

The control printed circuit board (CPCB) can be electrically connected to the source printed circuit board (SPCB) through a cable, and the source printed circuit board (SPCB) and the display panel DP can be electrically connected by the COF method. In a case in which the display panel DP is a smaller display panel, the control printed circuit board (CPCB) can be combined with the source printed circuit board (SPCB) to form a single circuit board.

In addition, in the touch display device 100 according to embodiments, the combined integrated circuits SRIC serve to supply the load-free common voltage VCOM_LFD generated thereby to the display panel DP as the touch driving signal TDS, and thus, can be referred to as the touch driving circuit 130.

The above description has been presented to enable any person skilled in the art to make and use the technical idea of the present invention, and has been provided in the context of a particular application and its requirements.

Various modifications, additions and substitutions to the described embodiments will be readily apparent to those skilled in the art, and the general principles defined herein can be applied to other embodiments and applications without departing from the spirit and scope of the present invention. The above description and the accompanying drawings provide an example of the technical idea of the present invention for illustrative purposes only. For example, the disclosed embodiments are intended to illustrate the scope of the technical idea of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. A touch display device comprising:
 a display panel including a plurality of touch electrodes;
 a gate driving circuit configured to supply a gate signal to a plurality of gate lines;
 a data driving circuit configured to supply a data voltage to a plurality of data lines;
 a touch power integrated circuit configured to generate a first level direct current (DC) voltage and a second level DC voltage; and
 a touch driving circuit configured to generate an alternating current (AC) touch driving signal using the first level DC voltage and the second level DC voltage, transfer the AC touch driving signal to the plurality of touch electrodes during a touch sensing period, and generate a touch sensing output voltage according to a change in capacitance of the plurality of touch electrodes,
 wherein the touch power integrated circuit is further configured to supply the first level DC voltage and the second level DC voltage to the touch driving circuit, and
 wherein the first level DC voltage is higher than the second level DC voltage.

2. The touch display device according to claim 1, wherein the touch driving circuit includes:
 a load-free common voltage generating circuit configured to generate a load-free common voltage using the first level DC voltage and the second level DC voltage; and
 a touch sensing circuit configured to generate a touch sensing output voltage using the load-free common voltage and a touch sensing signal transferred from the display panel.

3. The touch display device according to claim 2, wherein the load-free common voltage generating circuit includes:
 a first buffer circuit configured to receive the first level DC voltage; and
 a second buffer circuit configured to receive the second level DC voltage,
 wherein the first buffer circuit and the second buffer circuit generate output signals under control of a high-level switch and a low-level switch connected to output terminals thereof, respectively.

4. The touch display device according to claim 3, wherein the first buffer circuit comprises an operation amplifier configured to receive the first level DC voltage through a non-inverting input terminal thereof, with an output terminal thereof being connected to an inverting input terminal thereof, and
 the second buffer circuit comprises an operation amplifier configured to receive the second level DC voltage through a non-inverting input terminal thereof, with an output terminal thereof being connected to an inverting input terminal thereof.

5. The touch display device according to claim 2, wherein the touch sensing circuit includes:
 an operation amplifier configured to receive the load-free common voltage through a non-inverting input terminal thereof; and
 a feedback capacitor and a feedback switch connected in parallel between an inverting input terminal and an output terminal of the operation amplifier.

6. The touch display device according to claim 5, wherein the touch sensing circuit further includes:
 an integrating circuit configured to accumulate an output signal of the operation amplifier by predetermined times; and
 a sampling circuit configured to selectively transfer an output signal of the integrating circuit.

7. The touch display device according to claim 5, wherein the touch sensing circuit further includes:
 an input switch located between the display panel and the touch sensing circuit; and
 an output switch connected to the output terminal of the operation amplifier.

8. The touch display device according to claim 7, wherein, when the touch sensing circuit serves to amplify the touch sensing signal, the input switch and the output switch are turned on, and the feedback switch is turned off, and
 when the touch sensing circuit supplies the load-free common voltage to the plurality of touch electrodes, the input switch and the feedback switch are turned on, and the output switch is turned off.

9. The touch display device according to claim 2, further comprising a level shifter configured to adjust a level of the load-free common voltage to generate a level adjusted load-free gate low voltage,
 wherein the level shifter supplies the level adjusted load-free gate low voltage to the gate driving circuit.

10. The touch display device according to claim 1, wherein the gate driving circuit includes a load-free gate low voltage generating circuit configured to generate a load-free gate low voltage using a high-Level DC gate low voltage and a low-level DC gate low voltage, the high-level DC gate low voltage having a voltage level greater than a voltage level of the low-level DC gate low voltage.

11. The touch display device according to claim 10, wherein the load-free gate low voltage generating circuit includes:
 a first buffer circuit configured to receive the high-level DC gate low voltage; and
 a second buffer circuit configured to receive the low-level DC gate low voltage,
 wherein the first buffer circuit and the second buffer circuit generate output signals by controlling a high-level switch and a low-level switch connected to output terminals thereof, respectively.

12. The touch display device according to claim 11, wherein the first buffer circuit comprises an operation amplifier configured to receive the high-level DC gate low voltage through a non-inverting input terminal thereof, with an output terminal thereof being connected to an inverting input terminal thereof, and
 the second buffer circuit comprises an operation amplifier configured to receive the low-level DC gate low voltage through a non-inverting input terminal thereof, with an output terminal thereof being connected to an inverting input terminal thereof.

13. A driver circuit of a touch display device including a data driving circuit configured to supply a data voltage to a display panel including a plurality of touch electrodes, the driver circuit comprising:
   a load-free common voltage generating circuit configured to generate a load-free common voltage using a first level direct current (DC) voltage and a second level DC voltage transferred from outside of the driver circuit; and
   a touch sensing circuit configured to generate a touch sensing output voltage according to a change in capacitance of the plurality of touch electrodes, using the load-free common voltage and a touch sensing signal transferred from the display panel,
   wherein the first level DC voltage is higher than the second level DC voltage.

14. The driver circuit according to claim 13, wherein the load-free common voltage generating circuit includes:
   a first buffer configured to receive the first level DC voltage; and
   a second buffer configured to receive the second level DC voltage,
   wherein the first buffer and the second buffer generate output signals under control of a high-level switch and a low-level switch connected to output terminals thereof, respectively.

15. The driver circuit according to claim 13, wherein the touch sensing circuit includes:
   an operation amplifier configured to receive the load-free common voltage through a non-inverting input terminal thereof; and
   a feedback capacitor and a feedback switch connected in parallel between an inverting input terminal and an output terminal of the operation amplifier.

16. The driver circuit according to claim 15, wherein the touch sensing circuit further includes:
   an input switch located between the display panel and the touch sensing circuit; and
   an output switch connected to the output terminal of the operation amplifier.

17. The driver circuit according to claim 16, wherein, when the touch sensing circuit serves to amplify the touch sensing signal, the input switch and the output switch are turned on, and the feedback switch is turned off, and
   when the touch sensing circuit supplies the load-free common voltage to the plurality of touch electrodes, the input switch and the feedback switch are turned on, and the output switch is turned off.

18. A method of driving a touch display device including a gate driving circuit configured to supply a gate signal to a display panel including a plurality of touch electrodes, a data driving circuit configured to supply a data voltage to the display panel, a touch power integrated circuit, and a touch driving circuit, the method comprising:
   generating, by the touch power integrated circuit, a first level direct current (DC) voltage and a second level DC voltage;
   transferring the first level DC voltage and the second level DC voltage to the touch driving circuit;
   generating, by the touch driving circuit, an alternating current (AC) touch driving signal using the first level DC voltage and the second level DC voltage;
   transferring the touch driving signal to the plurality of touch electrodes during a touch sensing period;
   receiving a touch sensing signal according to a change in capacitance of the plurality of touch electrodes; and
   generating a touch sensing output voltage by amplifying the touch sensing signal,
   wherein the first level DC voltage is higher than the second level DC voltage.

19. The method according to claim 18, further comprising:
   adjusting a level of the touch driving signal to generate a level adjusted touch driving signal; and
   supplying the level adjusted touch driving signal to the gate driving circuit.

20. The method according to claim 18, further comprising:
   generating, by the gate driving circuit, an AC load-free gate low voltage using a high-level DC gate low voltage and a low-level DC gate low voltage, the high-level DC gate low voltage having a voltage level greater than a voltage level of the low-level DC gate low voltage; and
   supplying the load-free gate low voltage to gate lines during the touch sensing period.

* * * * *